United States Patent
Chou et al.

(10) Patent No.: US 9,768,214 B2
(45) Date of Patent: Sep. 19, 2017

(54) STRUCTURE OF DIELECTRIC GRID FOR A SEMICONDUCTOR DEVICE

(71) Applicant: Taiwan Semiconductor Manufacturing Company, Ltd., Hsin-Chu (TW)

(72) Inventors: Chun-Hao Chou, Tainan (TW); Yin-Chieh Huang, Tainan (TW); Kuo-Cheng Lee, Tainan (TW); Chi-Cherng Jeng, Tainan (TW); Hsin-Chi Chen, Tainan (TW)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 0 days.

(21) Appl. No.: 15/237,289

(22) Filed: Aug. 15, 2016

(65) Prior Publication Data

US 2016/0358962 A1  Dec. 8, 2016

Related U.S. Application Data

(60) Continuation of application No. 14/981,787, filed on Dec. 28, 2015, now Pat. No. 9,419,048, which is a division of application No. 14/088,957, filed on Nov. 25, 2013, now Pat. No. 9,224,781.

(51) Int. Cl.
*H01L 27/146* (2006.01)

(52) U.S. Cl.
CPC .... *H01L 27/14621* (2013.01); *H01L 27/1462* (2013.01); *H01L 27/1464* (2013.01); *H01L 27/14623* (2013.01); *H01L 27/14627* (2013.01); *H01L 27/14636* (2013.01); *H01L 27/14645* (2013.01); *H01L 27/14685* (2013.01)

(58) Field of Classification Search
CPC ........ H01L 27/14685; H01L 27/14621; H01L 27/14623
See application file for complete search history.

(56) References Cited

U.S. PATENT DOCUMENTS

| 8,502,334 | B2 | 8/2013 | Lee et al. |
| 8,940,574 | B2 | 1/2015 | Wang et al. |
| 9,123,839 | B2 | 9/2015 | Cheng et al. |
| 9,130,077 | B2 | 9/2015 | Weng et al. |
| 2010/0244173 | A1* | 9/2010 | Wang ............... H01L 27/14623 257/435 |
| 2012/0007200 | A1 | 1/2012 | Lee et al. |
| 2014/0264685 | A1 | 9/2014 | Cheng et al. |
| 2015/0048467 | A1 | 2/2015 | Weng et al. |

* cited by examiner

*Primary Examiner* — Dung Le
(74) *Attorney, Agent, or Firm* — Haynes and Boone, LLP (57) ABSTRACT

A device includes a substrate having a non-pixel region and a pixel region; sensor elements disposed in the pixel region; and a metal layer disposed over the substrate. The metal layer includes a metal shield disposed in the non-pixel region and first trenches over the respective sensor elements in the pixel region. The device further includes a dielectric layer disposed over the metal layer. The dielectric layer has second trenches over the respective sensor elements and third trenches over the metal shield. The first trenches are completely through the metal layer, and the second trenches are partially through the dielectric layer.

20 Claims, 8 Drawing Sheets

STRUCTURE OF DIELECTRIC GRID FOR A SEMICONDUCTOR DEVICE

PRIORITY

This is a continuation of U.S. application Ser. No. 14/981,787, entitled "Structure of Dielectric Grid for a Semiconductor Device" and filed Dec. 28, 2015, now issued U.S. Pat. No. 9,419,048, which is a divisional of U.S. application Ser. No. 14/088,957, entitled "Structure of Dielectric Grid for a Semiconductor Device" and filed Nov. 25, 2013, now issued U.S. Pat. No. 9,224,781. The entire disclosure of these applications is herein incorporated by reference.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array for detecting light and recording intensity (brightness) of the detected light. The pixel array responds to the light by accumulating a charge—the more light, the higher the charge. The charge can then be used, for example, by other circuitry, to indicate a color and/or brightness value, which can then be used for a suitable application such as a digital camera. Common types of pixel arrays include a charge-coupled device (CCD) image sensor or complimentary metal-oxide-semiconductor (CMOS) image sensor device.

One type of image sensor device is a backside illuminated image sensor (BSI) device. BSI devices are used for sensing a volume of light projected towards a backside surface of a substrate (which supports the image sensor circuitry of the BSI device). The pixel array is located at a front side of the substrate and the substrate is thin enough so that light projected towards the backside of the substrate can reach the pixel array. BSI devices provide a high fill factor and reduced destructive interference, as compared to front-side illuminated (FSI) image sensor devices. However, due to device scaling, improvements to BSI technology are continually needed to further improve BSI device quantum efficiency. Accordingly, although existing BSI devices and methods of fabricating these BSI devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
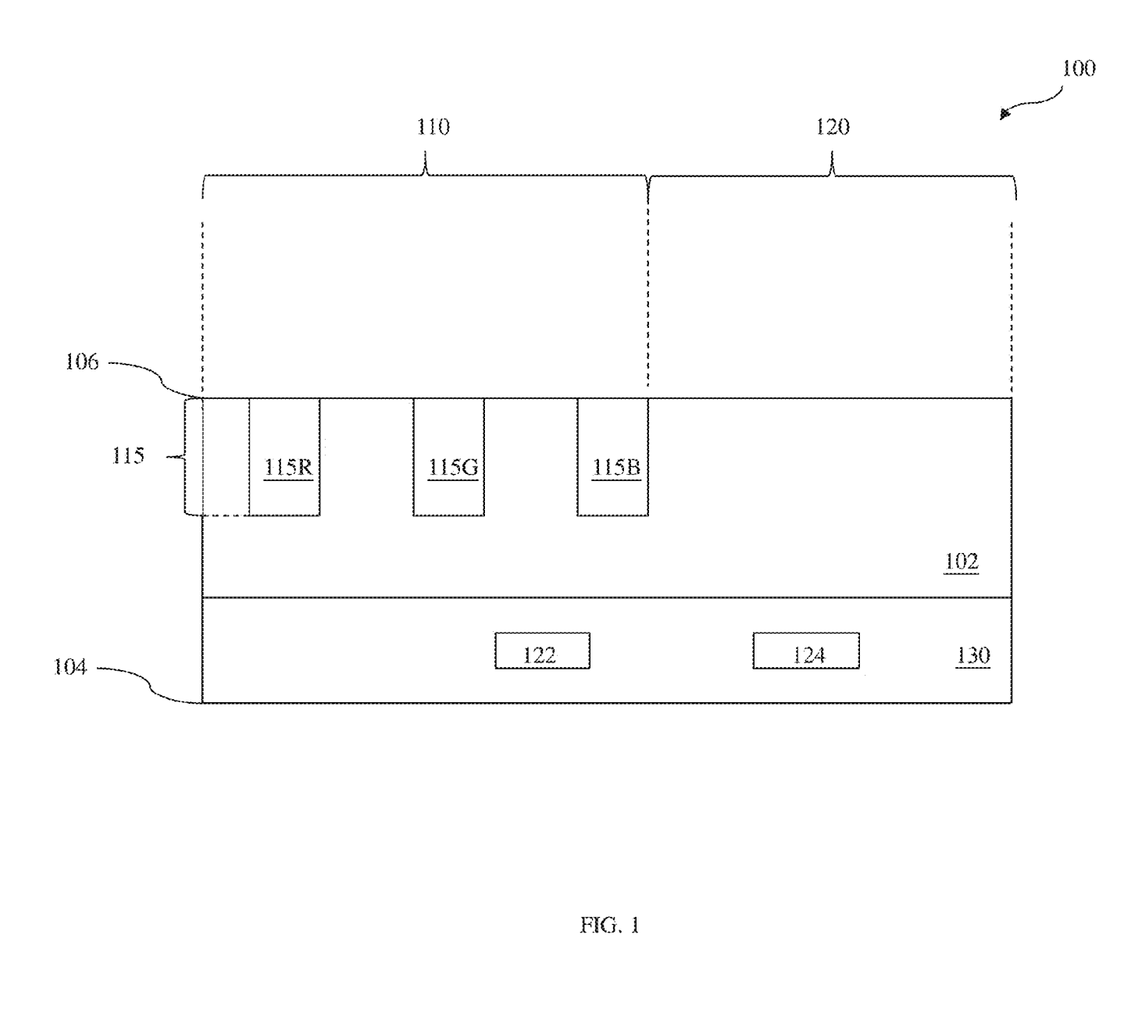
FIG. 1 is a diagrammatic sectional side view of an integrated circuit device precursor according to various aspects of the present disclosure.

FIG. 1 is a diagrammatic sectional side view, in portion, of an integrated circuit (IC) device precursor according to various aspects of the present disclosure. An example IC device precursor 100 may be an IC chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof.

The IC device precursor 100 may include a first semiconductor wafer stacked on top of a second semiconductor wafer. For example, the first semiconductor wafer is an image sensor, such as a backside illuminated image sensor (BSI), a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. For example, a p-type photo active region and an n-type photo active region are formed over a substrate of the image sensor wafer to form a PN junction, which functions as a photodiode. The image sensor may include a transistor to generate a signal related to the intensity or brightness of light that impinges on the photo active region. The second semiconductor wafer may be an application-specific integrated circuit (ASIC) wafer, or a carrier wafer.

The first and second semiconductor wafers may be bonded together through suitable bonding techniques such as direct bonding. In accordance with some embodiments, in a direct bonding process, the connection between the first and second semiconductor wafers can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or any combination thereof. In some embodiments, the first and second semiconductor wafers are connected to each other through suitable three-dimensional structure. An adhesion layer may also be used. Additionally, a thinning process may be performed to thin either or both semiconductor wafers from the back surface. The thinning process may include a mechanical grinding process and/or a chemical thinning process.

The IC device precursor 100 includes a substrate 102 having a front surface 104 and a back surface 106 (an upside-down position is shown in FIG. 1). In some embodiments, the substrate 102 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, the substrate 102 may include an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions. In FIG. 1, the substrate 102 is doped with a p-type dopant. Suitable p-type dopants include boron, gallium, indium, other suitable p-type dopants, and/or combinations thereof. The substrate 102 may also include one or more regions doped with an n-type dopant such as phosphorus, arsenic, other suitable n-type dopants, and/or combinations thereof. Doping may be implemented using a process such as ion implantation or diffusion in various steps and techniques.

The substrate 102 may include isolation features (not illustrated), such as local oxidation of silicon (LOCOS) and/or shallow trench isolation (STI), to separate (or isolate) various regions and/or devices formed on or within the substrate 102. The isolation features include silicon oxide, silicon nitride, silicon oxynitride, other suitable materials, or combinations thereof. The isolation features are formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

In the present embodiment, the IC device precursor 100 includes two regions, a pixel region 110 having a plurality of sensor elements 115 and a non-pixel region 120 adjacent to the pixel region 110 and has no sensor element in it. In one embodiment, the non-pixel region 120 is a logic region having additional circuitry and contacts for input and output connections to and from the array of pixel regions 110. The non-pixel region 120 may be utilized to provide an operating environment for the pixel regions 110 and to moderate communications between the array of pixel region 110 and outside devices (not shown).

The sensor elements 115 (also referred to as pixels) detect intensity (brightness) of radiation directed toward the back surface 106 of the substrate 102. In FIG. 1, the sensor elements 115 are configured to correspond with a specific light wavelength, such as a red (R), a green (G), or a blue (B) light wavelength. In other words, the sensor elements 115 are configured to detect intensity (brightness) of a particular light wavelength. In some embodiments, the sensor elements 115 are pixels in a pixel array.

In FIG. 1, the sensor elements 115 include a photodetector, such as a photodiode, that includes a light sensing region (or photo-sensing region) 115R, 115G, and 115B, respectively, which detect intensity (brightness) of red, green, and blue light wavelengths, respectively. The light sensing regions (or photo-sensing regions) 115R, 115G, and 115B may include doped regions having n-type and/or p-type dopants formed in the substrate 102. In some embodiments, the light sensing regions 115R, 115G, and 115B are n-type doped regions, formed by a method such as diffusion and/or ion implantation. The sensor elements 115 further include various transistors, such as a transfer transistor (not illustrated), a reset transistor (not illustrated), a source-follower transistor (not illustrated), a select transistor (not illustrated), other suitable transistors, or combinations thereof. The light sensing regions 115R, 115G, and 115B and various transistors (which can collectively be referred to as pixel circuitry) allow the sensor elements 115 to detect intensity of the particular light wavelength. Additional circuitry, input, and/or outputs may be provided to the sensor elements 115 to provide an operation environment for the sensor elements 115 and/or support communication with the sensor elements 115.

The IC device precursor 100 further includes multilayer interconnect (MLI) features disposed over the front surface 104 of the substrate 102, including over the sensor elements 115. The MLI features are coupled to various components of the image sensor, such as the sensor elements 115, such that the various components of the image sensor are operable to properly respond to illuminated light (imaging radiation). The MLI features may include various conductive features, which may be vertical interconnects, such as contacts and/or vias 122, and/or horizontal interconnects, such as lines 124. The various conductive features 122 and 124 may include conductive materials, such as metals. In an example, metals include aluminum, aluminum/silicon/copper alloy, titanium, titanium nitride, tungsten, polysilicon, metal silicide, or combinations thereof.

Conductive features 122 and 124 may be formed by a process including physical vapor deposition (PVD), chemical vapor deposition (CVD), or combinations thereof. Other manufacturing techniques to form the various conductive features 122 and 124 may include photolithography processing and etching to pattern conductive materials to form the vertical and horizontal interconnects. Still other manufacturing processes may be implemented to form the conductive features, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof.

It is understood that the MLI features are not limited by the number, material, size, and/or dimension of the conductive features 122 and 124 depicted, and thus, the MLI features may include any number, material, size, and/or dimension of conductive features depending on design requirements of the integrated circuit device precursor 100.

The various conductive features 122 and 124 of the MLI features are disposed in an interlayer (or inter-level) dielectric (ILD) layer 130. The ILD layer 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. Common methods for forming ILD layer 130 include thermal oxidation, chemical vapor deposition (CVD), high-density plasma CVD (HDP-CVD), physical vapor deposition (PVD), atomic layer deposition (ALD), spin-on deposition, and/or other suitable deposition processes. The ILD layer 130 may include multiple layers made by different dielectric materials.

Figure 2:
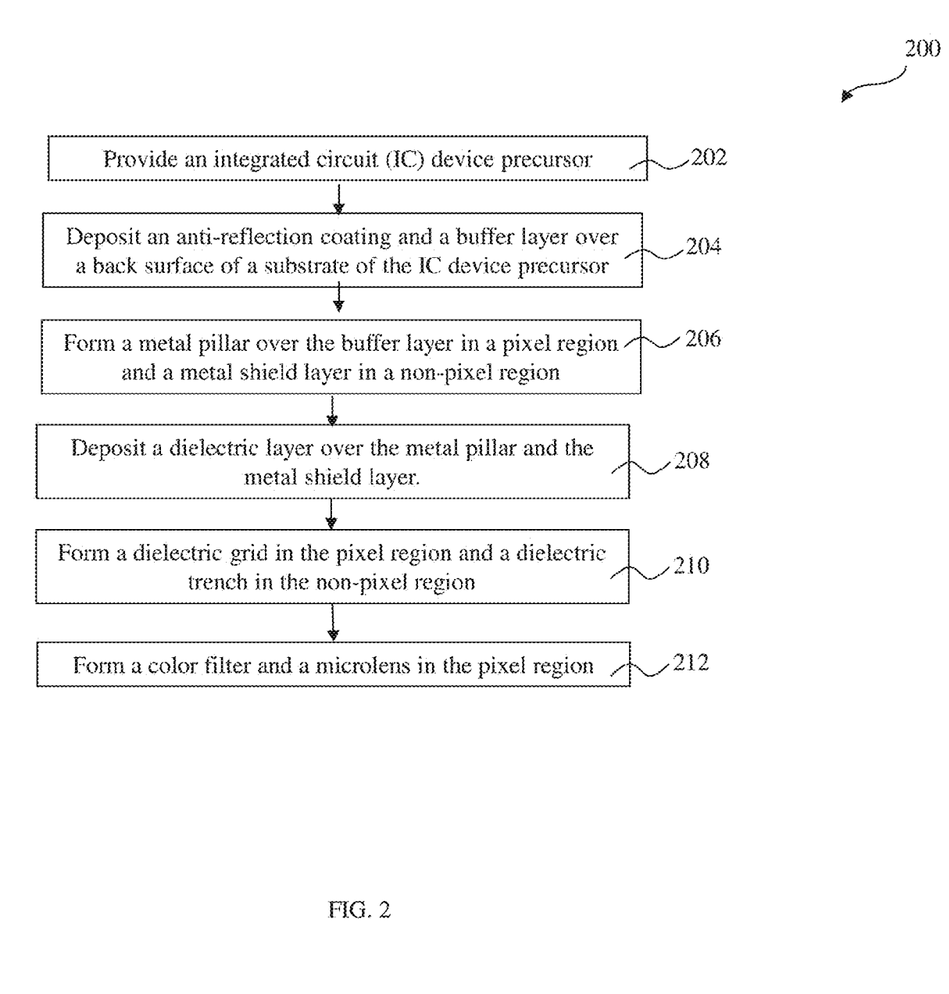
FIG. 2 is a flow chart of a method for fabricating a dielectric grid for an integrated circuit device according to various aspects of the present disclosure.

FIG. 2 is a flowchart of a method 200 of forming a dielectric grid and a dielectric trench for an integrated circuit device according to various aspects of the present disclosure. FIGS. 3-7 are cross-sectional views of an example IC device 300 undergoing processes according to the method of FIG. 2. It is understood that additional steps can be provided before, during, and after the method, and some of the steps described can be replaced or eliminated for other embodiments of the method.

Figure 3:
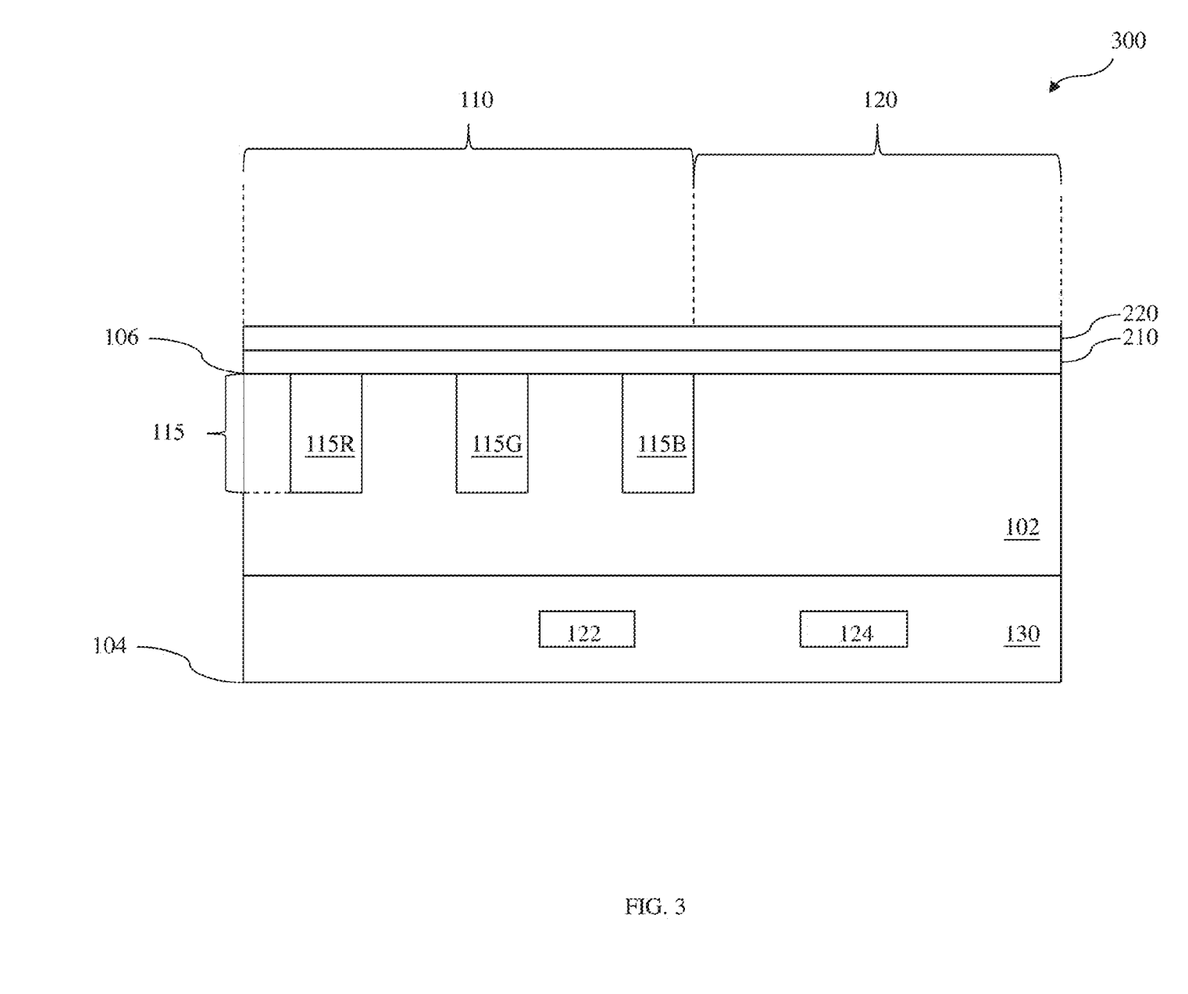
FIGS. 3, 4, 5, 6A, 6B, and 7 are diagrammatic sectional side views of an integrated circuit device at various fabrication stages according to the method of FIG. 2.

Referring to FIGS. 2 and 3, the method 200 begins at step 202 by providing the IC device precursor 100. The method then proceeds to step 204 by depositing an anti-reflection coating (ARC) layer 210 over the back surface 106 of the substrate 102 and a buffer layer 220 over the ARC layer 210. The ARC layer 210 may include a nitride material, an organic material; an oxide material and/or the like. The buffer layer 220 may include silicon nitride, silicon oxynitride and/or silicon carbide. One or more of the layers 210 and 220 may be formed by various methods, including CVD process such as atmospheric pressure CVD (APCVD), low pressure CVD (LPCVD), plasma enhanced CVD (PECVD), or high density plasma CVD (HDP CVD), spin-on coating, and/or other methods known in the art.

Figure 4:
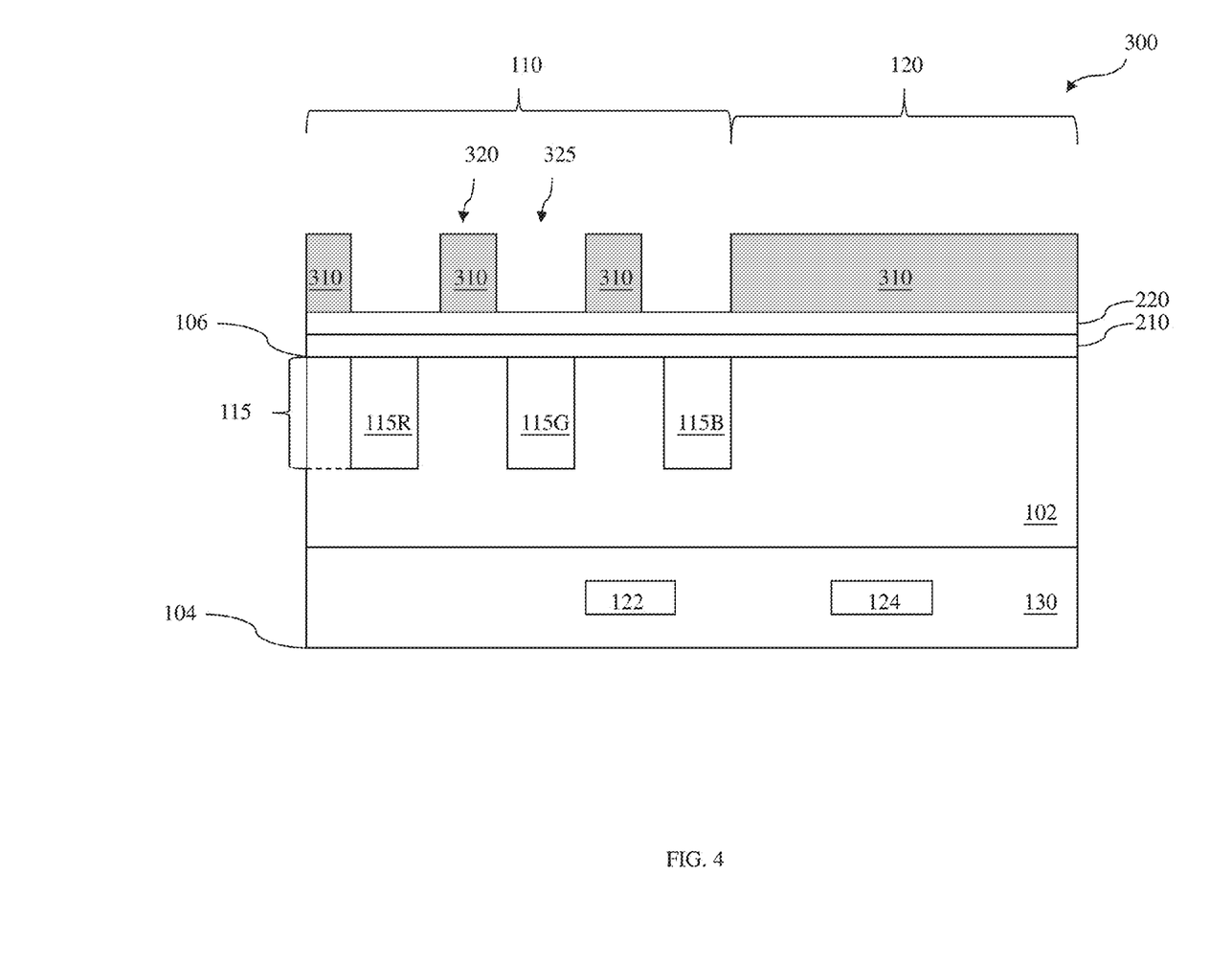

Referring to FIGS. 2 and 4, the method 200 proceeds to step 206 by forming metal pillars 320 in the pixel region 110 and a metal shield layer 310 in the non-pixel region 120 over the buffer layer 220. An open space between two adjacent metal pillars 320 is referred to as a metal trench 325. In one embodiment, the metal pillars 320 are aligned with a respective spacing between two adjacent sensor elements 115.

The metal pillar 320 may be formed by processes of deposition, lithography and etch. As an example, a metal layer 310 is deposited over the buffer layer 220 by PVD. The metal layer 310 may include tungsten (W), aluminum (Al), copper (Cu), or any suitable metals. Then a first patterned photoresist layer is formed over the metal layer 310 by processes of spin-on coating, exposure and developing. An etching process is then performed to etch the metal layer 310 through the first patterned photoresist to form the metal pillar 320 in the pixel region 110. In the non-pixel region 120, the metal layer 310 covered by the first patterned photoresist remains intact during the etching. For now on, the metal layer 310 in the non-pixel region is referred to as the metal shield layer 310. Alternatively, prior to coating the photoresist, a hard mask layer may be formed over the metal layer 310. Then, the hard mask layer is etched through the patterned photoresist layer first, and the metal layer 310 is etched through the etched hard mask layer to form the metal pillar 320 and the metal shield layer 310.

Figure 5:
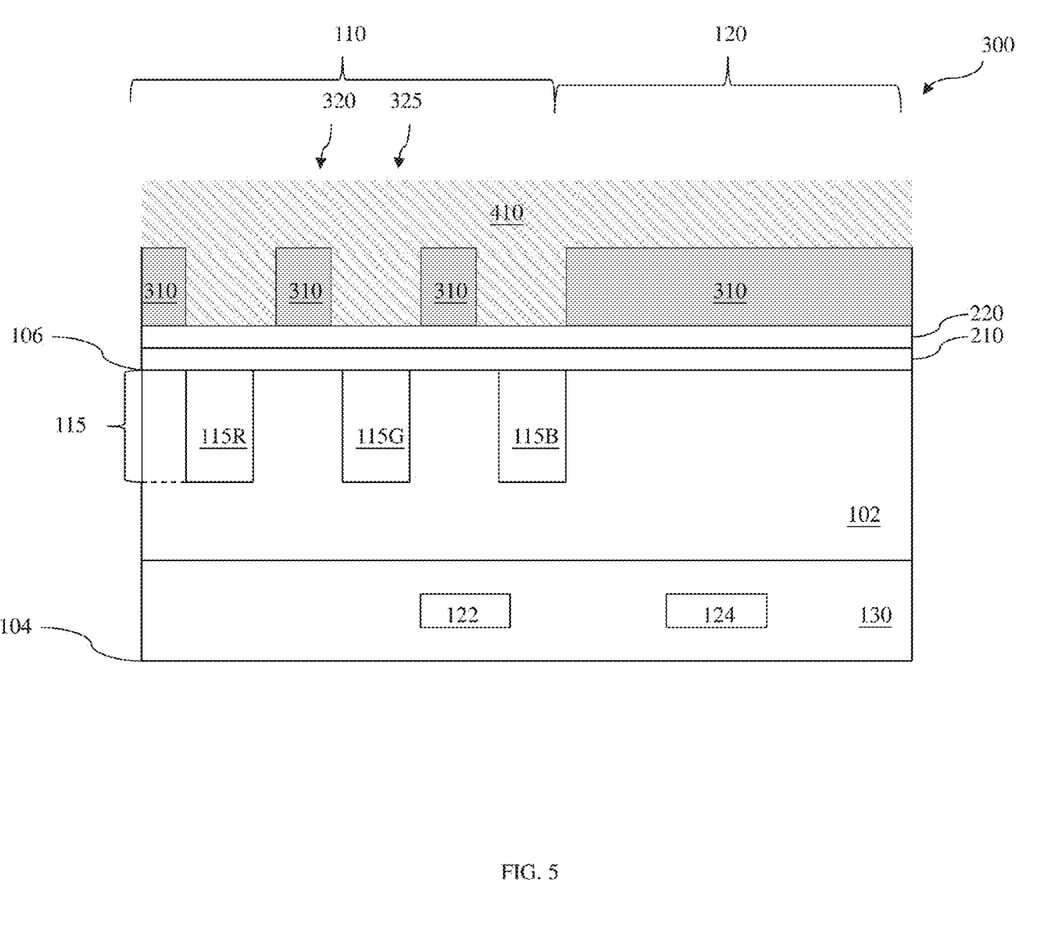

Referring to FIGS. 2 and 5, the method 200 proceeds to step 208 by depositing a dielectric layer 410 over the metal pillar 320, including filling in the metal trench 325, and over the metal shield layer 310. The dielectric layer 410 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. The dielectric layer 410 may also include high-k dielectric materials, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The dielectric layer 410 may be deposited by CVD, PVD, ALD, spin-on deposition, and/or other suitable deposition processes.

Figure 6A:
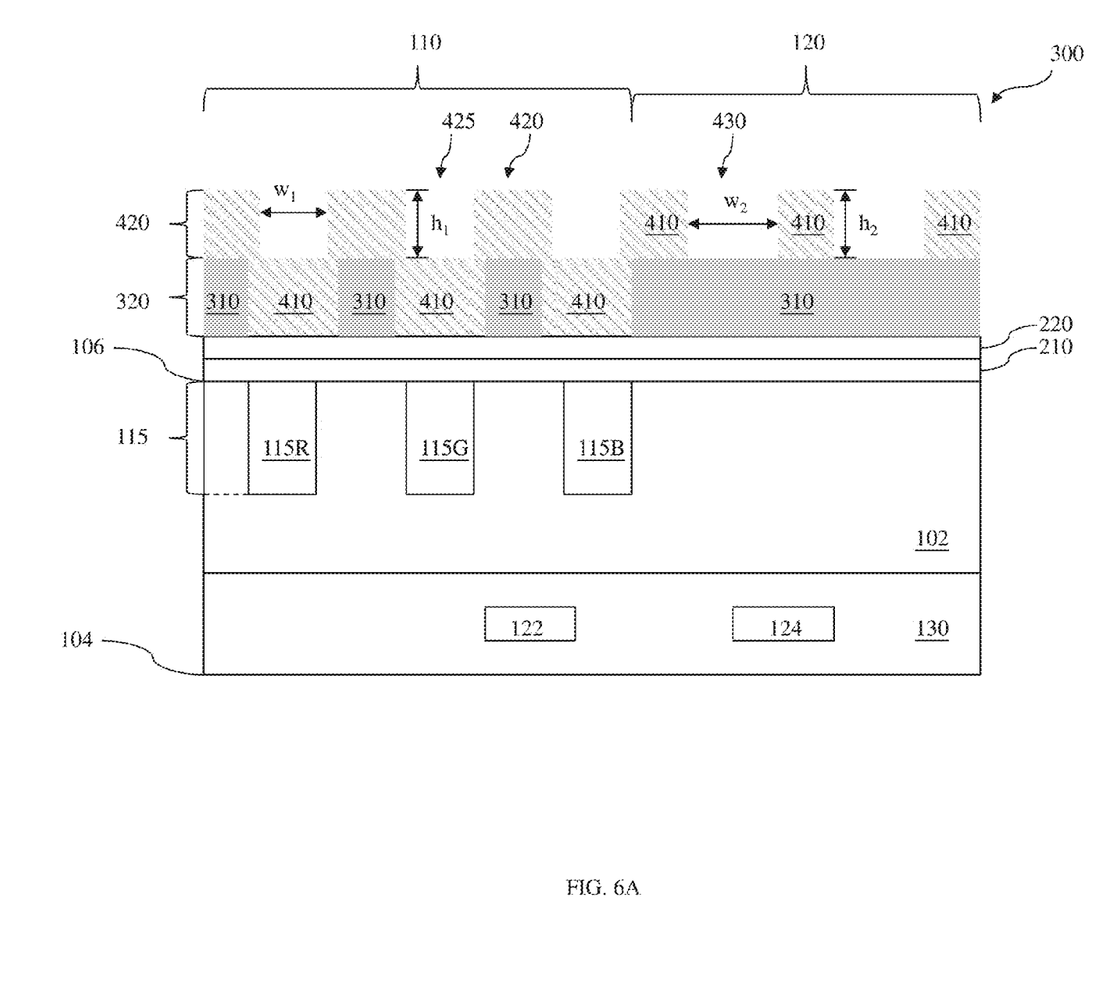
Figure 6B:
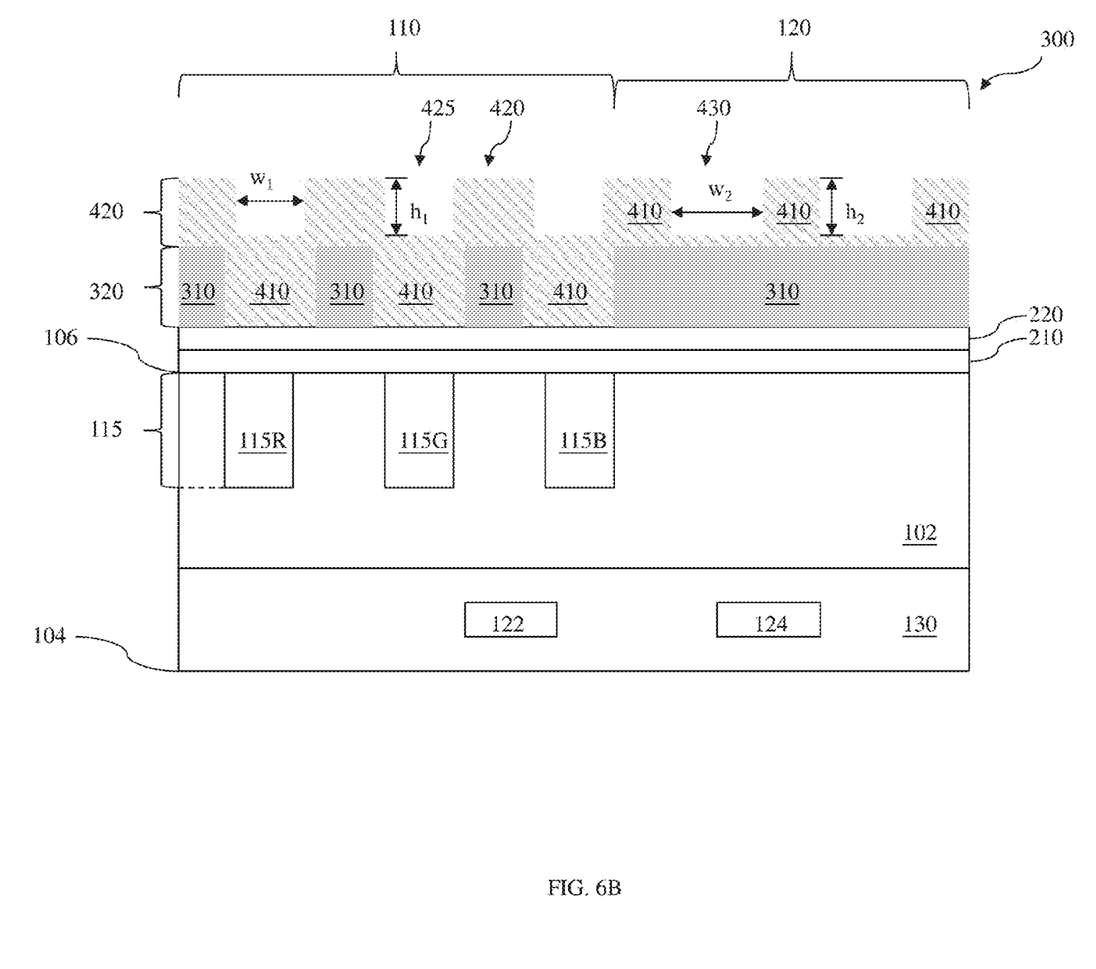

Referring to FIGS. 2 and 6A-6B, the method 200 proceeds to step 210 by etching the dielectric layer 410 to form dielectric grids 420 in the pixel region 110 and dielectric trenches 430 in the non-pixel region 120. In one embodiment, the dielectric grids 420 are formed on top of the respective metal pillars 320, including wrapping around the respective metal pillar 320. An open space between two adjacent dielectric grids 420 is referred to as a first dielectric trench 425. The first dielectric trench 425 has a first width $w_1$ and a first height $h_1$. (The height of the trench refers to the depth of the trench). The dielectric trench 430 is referred to as a second dielectric trench and has a second width $w_2$ and a second height $h_2$.

In one embodiment, a second patterned photoresist layer is formed over the dielectric layer 410 and the dielectric layer 410 is then etched to form the dielectric grid 420, the first dielectric trench 425 and the second dielectric trench 430. A depth of etch is controlled that the metal shield layer 310 is exposed at the bottom of the second dielectric trench 430, as shown in FIG. 6A. In another embodiment, the depth of the etch is controlled that a portion of the dielectric layer 410 remains as a bottom portion of the second dielectric trench 430, as shown in FIG. 6B.

In one embodiment, the second dielectric trench 430 is formed to have the same width and same height as the first dielectric trench 425. In another embodiment, the second dielectric trench 430 is formed to have various the second width $w_2$, which is in a range from 50% of the first width $w_1$ to two times of the of the first width $w_1$ of the first dielectric trench 425. In another embodiment, the second height $h_2$ of the second dielectric trench is at lease 50% of the first height $h_1$ of the first dielectric trench. In the present embodiment, there are at least three of the second dielectric trenches being formed in the non-pixel region. Having the second dielectric trench 430, topography of the non-pixel region 120 is made to be substantially similar to topography of the pixel region 110. In other words, the pixel region and the non-pixel region have a fairly uniform topography.

Figure 7:
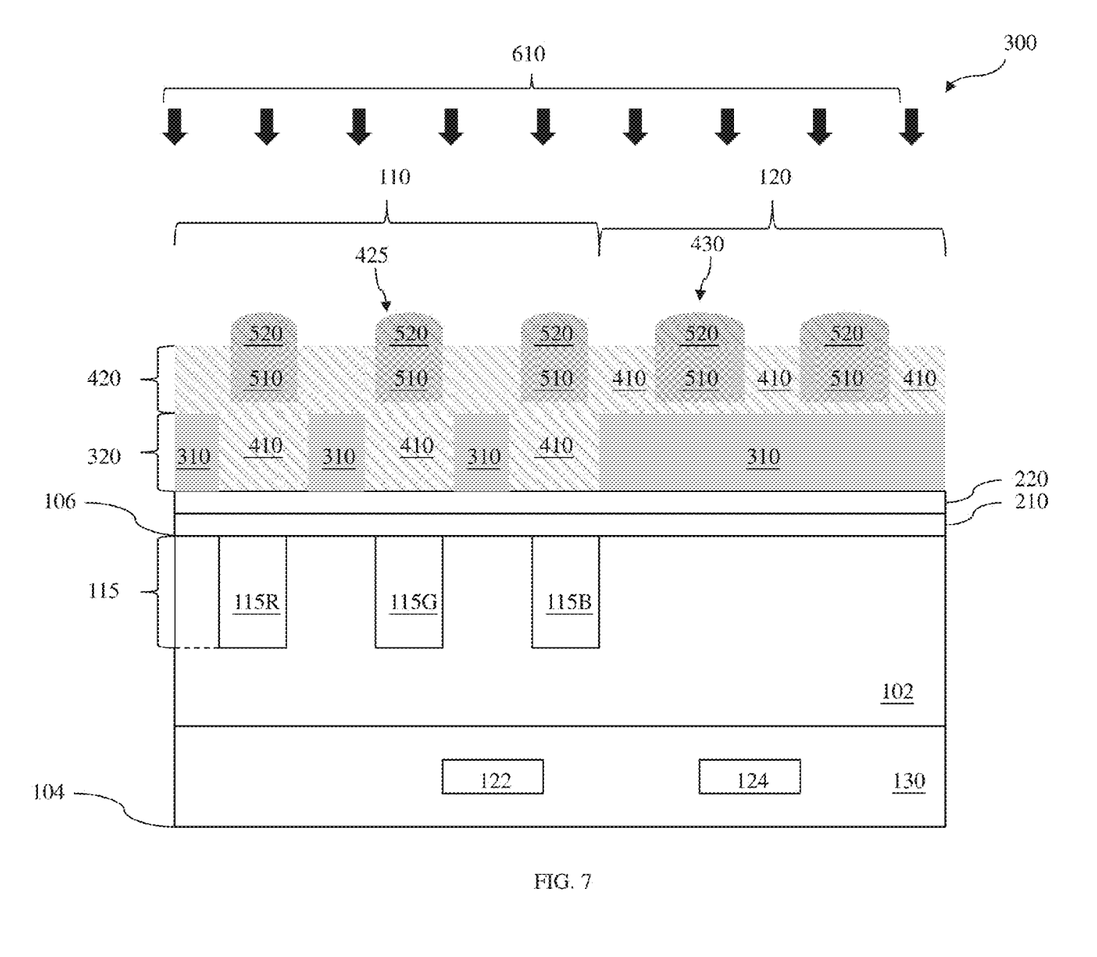

Referring to FIGS. 2 and 7, the method 200 proceeds to step 212 by forming color filters 510 and microlenses 520 over the back surface 106 of the substrate 102. In some embodiments, each of the color filters 510 aligns with the respective light sensing regions 115R, 115G, and 115B. The color filters 510 are designed so that each filters through light of a predetermined wavelength. For example, the color filter 510 aligned with the light sensing region 115R may be configured to filter through visible light of a red wavelength to the light sensing region 115R, the color filter 510 aligned with the light sensing region 115G may be configured to filter through visible light of a green wavelength to the light sensing region 115G, or the color filter 510 aligned with the light sensing region 115B may be configured to filter through visible light of a blue wavelength to the light sensing region 115B. The color filters 510 include any suitable material. In an example, the color filters 510 include a dye-based (or pigment-based) polymer for filtering out a specific frequency band (for example, a desired wavelength of light). Alternatively, the color filters 510 could include a resin or other organic-based material having color pigments.

In the present embodiment, the microlenses 520, disposed over the back surface 106 of the substrate 102, align with respective light sensing regions 115R, 115G, and 115B of the sensor elements 115. In some embodiments, the microlenses 520 are disposed over the color filters 510. The microlenses 520 may be in various positional arrangements with the sensor elements 115 and color filters 510, such that the microlens 520 focuses an incoming incident radiation on the respective light sensing regions 115R, 115G, and 115B of the sensor elements 115. The microlenses 520 include a suitable material, and may have a variety of shapes and sizes depending on an index of refraction of the material used for the microlens and/or a distance between the microlens and sensor elements 115. Alternatively, the position of the color filters 510 and microlens layer 520 may be reversed, such that the microlenses 520 are disposed between the back surface 106 of the substrate 102 and color filters 510.

In present embodiment, the color filter 510 and the microlense 520 are formed by a suitable process, such as deposition and patterning. For example, the color filters 510, as well as the microlens 520, is disposed over the dielectric layer 410 and filled up the first dielectric trench 425 and the second dielectric trench 430 by spin-on coating. Having the second dielectric trenches 430 in the non-pixel region 120, the color filter 510, as well as the microlens 520, is spin-on coated on the pixel region 110 and the non-pixel region 120, which has an uniform topography. It results in improving thickness uniformity and reducing variation of the color filter 510, as well as the microlens 520, among locations.

Referring also to FIG. 7, in operation, the integrated circuit device 300 is designed to receive a radiation 610 traveling towards the back surface 106 of the substrate 102. In the depicted embodiment, the incident radiation 610 is visual light. Alternatively, the radiation 610 could be infrared (IR), ultraviolet (UV), X-ray, microwave, other suitable radiation type, or combinations thereof. The microlenses 520 direct the incident radiation 610 to the respective color filters 510. The light then passes through the color filters 510 to a corresponding sensor element 115, specifically to respective light sensing regions 115R, 115G, and 115B. Light passing through to the color filters 510 and sensor elements 115 may be maximized since the light is not obstructed by various device features (for example, gate electrodes) and/or metal features (for example, the conductive features 122 and 124 of the MLI features) overlying the front surface 104 of the substrate 102. The desired wavelengths of light (for example, red, green, and blue light) are more efficiently allowed to pass through to the respective light sensing regions 115R, 115G, and 115B of the sensor elements 115. When exposed to the light, the light sensing regions 115R, 115G, and 115B of the sensor elements 115 produce and accumulate (collect) electrons, which may be converted to voltage signals.

Additional layer can be formed before, between, or over layers mentioned above and some of the layers described can be replaced, eliminated, or moved around for additional embodiments of the method 200. For example, a capping layer may be deposited over the sidewalls of the dielectric grid 420 as a moisture resistant layer.

Based on the above, the present disclosure offers an integrated circuit device employing a structure of a dielectric trench in a non-pixel region which is adjacent to a pixel region, where dielectric grids are formed, to provide a uniform topography for subsequent formations of color filter and microlenses. The structure demonstrates improvement of thickness uniformity and reduction of variation of color filters and microlenses.

The present disclosure provides for many different embodiments. For example, an image sensor device includes a substrate, a pixel region and a non-pixel region in the substrate. In the pixel region there is a plurality of sensor elements. The non-pixel region is adjacent to the pixel region and has no sensor element. The image sensor device also includes dielectric grids in the pixel region with a first dielectric trench between two adjacent dielectric grids. The first dielectric trench aligns to a respective sensor element. The image sensor device also includes second dielectric trenches in the non-pixel region.

In another embodiment, a device includes a substrate having a non-pixel region adjacent to a pixel region. A plurality of sensor elements is disposed at a front surface of the substrate in the pixel region. The plurality of sensor elements is operable to sense radiation projected towards a back surface of the substrate. The device also includes dielectric grids disposed over the back surface of the substrate in the pixel region. The dielectric grid includes a metal pillar as its low portion and a dielectric layer as its upper portion, including wrapping around the metal pillar. The device also includes a first dielectric trench between two adjacent dielectric grids, a second dielectric trench over the back surface of the substrate in the non-pixel region and a plurality of color filters and microlenses disposed over the first dielectric trench and aligned with respective sensor elements.

In yet another embodiment, a method for fabricating a device includes providing a substrate having a pixel region and a non-pixel region adjacent to the pixel region. A plurality of sensor elements is disposed in the pixel region. The method also includes depositing an anti-reflection coating (ARC) layer over the substrate, depositing a buffer layer over the ARC layer, depositing a metal layer over the buffer layer, etching the metal layer through a first patterned mask layer to form metal pillars in the pixel region and a metal shield layer in the non-pixel region, depositing a dielectric layer over the metal pillar and the metal shield layer, etching the dielectric layers through a second mask to form a dielectric grid, including wrapping around the metal pillar in the pixel region and dielectric trenches over the metal shield layer in the pixel region. The method also includes forming a color filter and a microlens over the substrate, aligning to respective sensor elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate having a non-pixel region and a pixel region;
sensor elements disposed in the pixel region;
a metal layer disposed over the substrate, wherein the metal layer includes a metal shield disposed in the non-pixel region and first trenches over the respective sensor elements in the pixel region; and
a dielectric layer disposed over the metal layer, wherein the dielectric layer has second trenches over the respective sensor elements and third trenches over the metal shield,
wherein the first trenches are completely through the metal layer, and the second trenches are partially through the dielectric layer.

2. The device of claim 1, wherein the dielectric layer completely fills the first trenches.

3. The device of claim 1, wherein the third trenches are completely through the dielectric layer.

4. The device of claim 1, wherein the third trenches are partially through the dielectric layer.

5. The device of claim 1, wherein a width of the first trenches is greater than a width of the second trenches.

6. The device of claim 1, wherein a width of the third trenches is from 50% to 200% of a width of the second trenches.

7. The device of claim 1, wherein a depth of the third trenches is at least 50% of a depth of the second trenches.

8. The device of claim 1, wherein there are at least three third trenches over the metal shield.

9. The device of claim 1, further comprising:
an anti-reflection coating (ARC) layer over the substrate; and
a buffer layer over the ARC layer, wherein the metal layer and the dielectric layer are disposed over the buffer layer.

10. The device of claim 1, wherein the metal layer includes tungsten, aluminum, or copper.

11. The device of claim 1, further comprising:
color filters disposed in the second and third trenches.

12. The device of claim 1, wherein the second trenches do not expose the metal layer.

13. A device comprising:
a semiconductor substrate having a non-pixel region adjacent to a pixel region;
sensor elements disposed in the pixel region and not in the non-pixel region;
a metal layer disposed over the substrate, wherein the metal layer includes first trenches directly over the respective sensor elements in the pixel region and no trenches in the non-pixel region;
a dielectric layer disposed over the metal layer, wherein the dielectric layer has second trenches directly over the respective sensor elements in the pixel region and third trenches over the metal layer in the non-pixel region; and
color filters disposed in the second and third trenches, wherein the first trenches go through the metal layer, and the second trenches do not go through the dielectric layer.

14. The device of claim 13, wherein the third trenches go through the dielectric layer.

15. The device of claim 13, wherein the third trenches do not go through the dielectric layer.

16. The device of claim 13, wherein there are at least three third trenches in the non-pixel region.

17. The device of claim 13, wherein a width of the third trenches is from 50% to 200% of a width of the second trenches, and a depth of the third trenches is at least 50% of a depth of the second trenches.

18. The device of claim 13, wherein the second trenches do not expose the metal layer.

19. A device comprising:
a substrate having a non-pixel region adjacent to a pixel region;
sensor elements disposed in the pixel region;
a patterned metal layer disposed over the substrate, wherein the patterned metal layer has holes directly over the respective sensor elements in the pixel region and has no holes in the non-pixel region; and
a patterned dielectric layer disposed over the patterned metal layer and having first trenches directly over the respective sensor elements in the pixel region and second trenches in the non-pixel region, wherein the first trenches do not expose the patterned metal layer and do not go through the dielectric layer.

20. The device of claim 19, wherein a depth of the second trenches is at least 50% of a depth of the first trenches.

* * * * *